(12) United States Patent
Watabe et al.

(10) Patent No.: US 8,773,183 B2
(45) Date of Patent: Jul. 8, 2014

(54) FRACTIONAL PLL CIRCUIT

(75) Inventors: Yuji Watabe, Takaishi (JP); Tohru Kanno, Kawasaki (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/004,967

(22) PCT Filed: Mar. 12, 2012

(86) PCT No.: PCT/JP2012/056794
§ 371 (c)(1),
(2), (4) Date: Sep. 13, 2013

(87) PCT Pub. No.: WO2012/124793
PCT Pub. Date: Sep. 20, 2012

(65) Prior Publication Data
US 2014/0002151 A1    Jan. 2, 2014

(30) Foreign Application Priority Data

Mar. 17, 2011 (JP) .................................. 2011-059148

(51) Int. Cl.
*H03L 7/06*    (2006.01)
(52) U.S. Cl.
USPC .......................................... 327/156; 327/147
(58) Field of Classification Search
CPC .......... H03L 7/0891; H03L 7/18; H03L 7/903
USPC ................................................ 327/147, 156
See application file for complete search history.

(56) References Cited

U.S. PATENT DOCUMENTS

| | | | |
|---|---|---|---|
| 7,356,111 B1* | 4/2008 | Dean ............................. | 375/376 |
| 8,421,508 B2* | 4/2013 | Hirai et al. .................... | 327/156 |
| 2002/0105387 A1 | 8/2002 | Jovenin | |
| 2002/0113658 A1 | 8/2002 | Jovenin et al. | |
| 2002/0118074 A1 | 8/2002 | Jovenin | |
| 2002/0160730 A1 | 10/2002 | Nozahic et al. | |

(Continued)

FOREIGN PATENT DOCUMENTS

| | | |
|---|---|---|
| JP | 9-282044 | 10/1997 |
| JP | 2002-185320 | 6/2002 |

(Continued)

OTHER PUBLICATIONS

International Search Report issued on Jun. 5, 2012 in PCT/JP2012/056794 filed on Mar. 12, 2012.

*Primary Examiner* — Adam Houston
(74) *Attorney, Agent, or Firm* — Cooper & Dunham LLP (57) ABSTRACT

A fractional PLL circuit includes: a phase comparator for detecting a phase difference, and which outputs a controlled voltage; a voltage-controlled oscillator for generating and outputting an output clock signal; a phase-selection circuit for selecting any one of a predetermined number of phases into which one period of a clock of the output clock signal is equally divided, generating a phase-shift clock signal having a rising edge in the selected phase, and outputting the phase-shift clock signal to the phase comparator; and a phase controller for determining a phase of the rising edge of the phase-shift clock signal selected by the phase-selection circuit such that a period of the phase-shift clock signal is a length that is changed by a predetermined phase-shift amount from a period of the output clock signal, and controlling the phase-selection circuit so as to select the determined phase.

4 Claims, 11 Drawing Sheets

(56) References Cited

U.S. PATENT DOCUMENTS

| | | | |
|---|---|---|---|
| 2006/0245531 A1* | 11/2006 | Leonowich et al. | 375/376 |
| 2006/0268971 A1 | 11/2006 | Watabe | |
| 2009/0267664 A1* | 10/2009 | Uozumi et al. | 327/158 |
| 2011/0156773 A1* | 6/2011 | Beccue | 327/156 |
| 2012/0223755 A1* | 9/2012 | Gomm | 327/158 |
| 2012/0235717 A1* | 9/2012 | Hirai et al. | 327/156 |
| 2013/0169335 A1* | 7/2013 | Gomm | 327/256 |
| 2013/0222026 A1* | 8/2013 | Havens | 327/158 |
| 2013/0271186 A1* | 10/2013 | Hossain et al. | 327/107 |
| 2013/0314131 A1* | 11/2013 | Gomm | 327/107 |

FOREIGN PATENT DOCUMENTS

| | | |
|---|---|---|
| JP | 2006-260667 | 9/2006 |
| JP | 2007-288375 | 11/2007 |
| JP | 2008-172512 | 7/2008 |

\* cited by examiner

FRACTIONAL PLL CIRCUIT

TECHNICAL FIELD

The present invention relates to a fractional PLL (Phase-Locked Loop) circuit that has a rational number frequency division ratio.

BACKGROUND ART

In the technical field of PLL circuits, a fractional PLL circuit that has a rational number frequency division ratio is known (for example, see Japanese Patent Application Publication Number 2007-288375).

Figure 12:
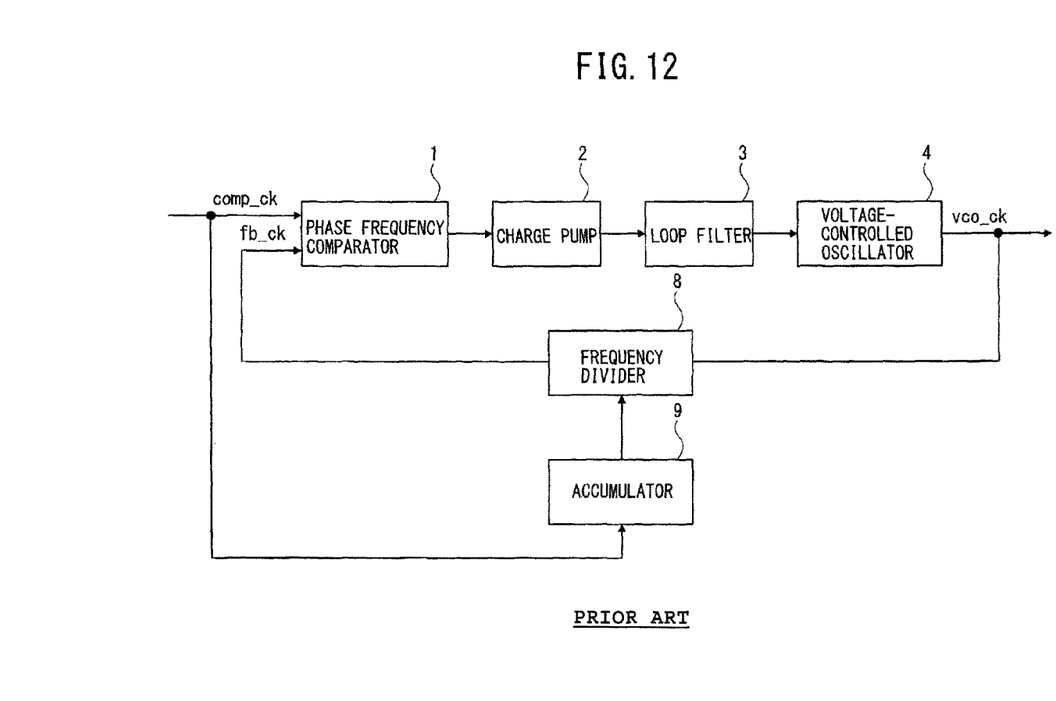
FIG. 12 is a block diagram illustrating a constitution of a fractional PLL circuit according to a conventional technique.

FIG. 12 is a block diagram illustrating a constitution of a fractional PLL circuit according to a conventional technique. To a phase frequency comparator 1, an input clock signal comp_ck that is generated by a reference clock generator (not illustrated) and becomes a reference signal, and a feedback signal fb_ck are inputted. The phase frequency comparator 1 detects a phase difference between the two inputted signals and outputs it to a charge pump 2. The charge pump 2 outputs a charge pump voltage that is increased or decreased in accordance with the phase difference to a loop filter 3. The loop filter 3 outputs a control voltage based on the charge pump voltage to a voltage-controlled oscillator (VCO) 4.

The voltage-controlled oscillator 4 generates an output clock signal vco_ck that has a frequency and a phase based on the control voltage, and outputs it. The output clock signal vco_ck is frequency-divided by a frequency divider 8, and inputted to the phase frequency comparator 1 as the feedback signal fb_ck. A frequency division ratio of the frequency divider 8 is periodically switched between predetermined integers N and N+1 according to a count value of an accumulator 9 that counts the input clock signal comp_ck. The fractional PLL circuit performs negative feedback control such that a frequency and a phase of the feedback signal fb_ck correspond to a frequency and a phase of the input clock signal comp_ck. Additionally, by switching the frequency division ratio of the frequency divider 8, an averaged frequency division ratio as a decimal fraction between N and N+1 is achieved.

In the fractional PLL circuit that changes a frequency division ratio of the frequency divider 8, a phase mismatch occurs in the phase frequency comparator 1 when changing the frequency division ratio. Due to the phase mismatch, a spurious signal is mixed in the output clock signal vco_ck of the voltage-controlled oscillator 4, and a jitter characteristic of the output clock signal vco_ck deteriorates.

Additionally, in the fractional PLL circuit according to the conventional technique, in order to perform fine frequency dividing, it is necessary to increase a frequency division ratio N of the frequency divider 8, and it is not possible to increase a frequency of a signal inputted to the phase frequency comparator 1. Therefore, it is not possible to broaden a loop bandwidth of the fractional PLL circuit, phase noise of the voltage-controlled oscillator 4 increases, and the jitter characteristic deteriorates.

SUMMARY OF THE INVENTION

An object of the present invention is to solve the above-described problems, and to provide a new fractional PLL circuit which decreases jitter of an output clock signal not by a principle of operation that changes a frequency division ratio of a frequency divider.

In order to achieve the above object, embodiments of the present invention provides a fractional PLL circuit comprising: a phase comparator that detects a phase difference between an input clock signal that is a reference and a feedback signal, and outputs a controlled voltage in accordance with the phase difference; a voltage-controlled oscillator that generates and outputs an output clock signal that has a frequency based on the controlled voltage; a phase-selection circuit that selects any one of a predetermined number of phases into which one period of a clock of the output clock signal is equally divided, generates a phase-shift clock signal that has a rising edge in the selected phase, and outputs the phase-shift clock signal as the feedback signal to the phase comparator; and a phase controller that determines a phase of the rising edge of the phase-shift clock signal selected by the phase-selection circuit such that a period of the phase-shift clock signal is a length that is changed by a predetermined phase-shift amount from a period of the output clock signal, and controls the phase-selection circuit so as to select the determined phase.

BRIEF DESCRIPTION OF THE DRAWINGS

Each of FIG. 2

DESCRIPTION OF EMBODIMENTS

First Embodiment

Figure 1:
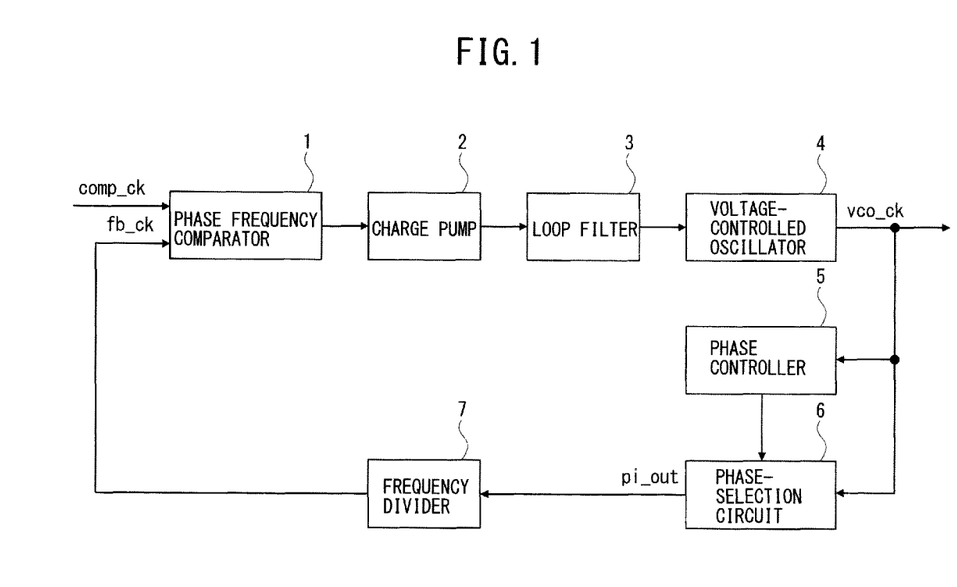
FIG. 1 is a block diagram illustrating a constitution of a fractional PLL circuit according to a first embodiment of the present invention.

FIG. 1 is a block diagram illustrating a constitution of a fractional PLL circuit according to a first embodiment of the present invention. A phase frequency comparator 1, a charge pump 2, a loop filter 3, and a voltage-controlled oscillator 4 are the same as shown in the corresponding constituents illustrated in FIG. 12. To the phase frequency comparator 1, an input clock signal comp_ck generated by a reference clock generator (not illustrated) and which becomes a reference signal, and a feedback signal fb_ck are, inputted. The phase frequency comparator 1 detects a phase difference between the two inputted signals and outputs it to a charge pump 2. The charge pump 2 outputs a charge pump voltage that is increased or decreased in accordance with the phase difference to a loop filter 3. The loop filter 3 outputs a control voltage based on the charge pump voltage to a voltage-controlled oscillator (VCO) 4. The voltage-controlled oscillator 4 generates an output clock signal vco_ck that has a frequency and a phase based on the control voltage and outputs it. In a feedback path from the voltage-controlled oscillator 4 to the phase frequency comparator 1, a phase-selection circuit 6 that operates under the control of a phase controller 5, and a frequency divider 7 that has a fixed integer frequency division ratio are provided. The phase-selection circuit 6, by changing a phase of a rising edge of the output clock signal vco_ck, generates a phase-shift clock signal pi_out that has a period that is changed from a period of the output clock signal vco_ck, and outputs it. Specifically, the phase-selection circuit 6 selects any one of a predetermined number of phases into which one period of a clock of the output clock signal vco_ck is equally divided, generates a phase-shift clock signal pi_out that has a rising edge in the selected phase, and outputs it. The phase controller 5 determines a phase of a rising edge of a phase-shift clock signal pi_out selected by the phase-selection circuit 6 such that a period of a phase-shift clock signal pi_out is a length that is changed by a predetermined phase-shift amount $\Delta ph$ (integral multiple of the above equally divided phase) from the period of the output clock signal vco_ck, and controls the phase-selection circuit 6 so as to select the determined phase. The frequency divider 7 frequency-divides the phase-shift clock signal pi_out, and inputs it as a feedback signal fb_ck to the phase frequency comparator 1.

The fractional PLL circuit according to the present embodiment performs a negative feedback control such that a frequency and a phase of the feedback signal fb_ck correspond to a frequency and a phase of the input clock signal comp_ck.

In addition, the fractional PLL circuit according to the present embodiment achieves a rational number frequency division ratio, by generating a phase-shift clock signal pi_out that has a period that is changed from a period of the output clock signal vco_ck by the phase-selection circuit 6, not by a principle of operation that changes a frequency division ratio of the frequency divider. In a case where the frequency division ratio of the frequency divider 7 is 1, and the phase-shift amount $\Delta ph$ is positive, a frequency of the output clock signal vco_ck becomes higher than the frequency of the input clock signal comp_ck, and in a case where the phase-shift amount $\Delta ph$ is negative, the frequency of the output clock signal vco_ck becomes lower than the frequency of the input clock signal comp_ck. Likewise, in a case where the frequency division ratio of the frequency divider 7 is equal to or more than 2, the frequency of the output clock signal vco_ck changes with regard to a frequency multiplied from the frequency of the input clock signal comp_ck, and in a case where the phase-shift amount $\Delta ph$ is positive, the frequency of the output clock signal vco_ck becomes higher than the multiplied frequency, and in a case where the phase-shift amount $\Delta ph$ is negative, the frequency of the output clock signal vco_ck becomes lower than the multiplied frequency.

Figure 2:
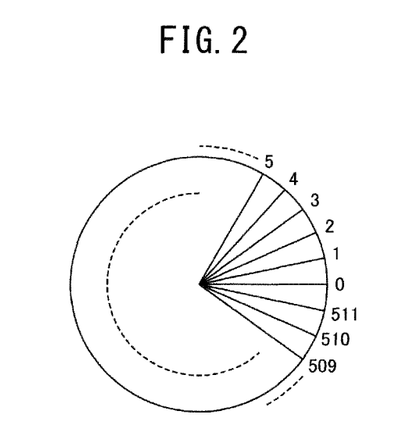
Figure 3:
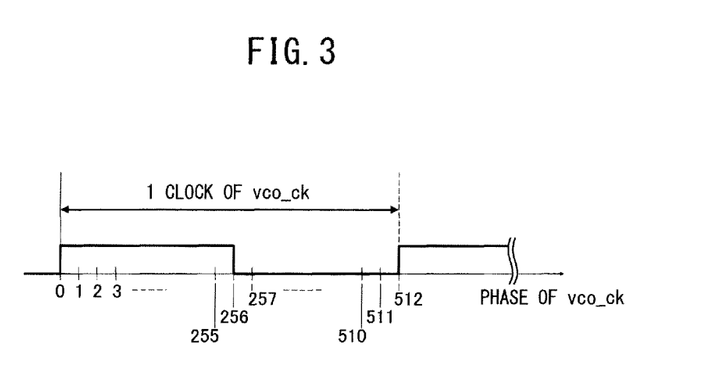
FIG. 3 is a diagram explaining a phase of an output clock signal vco_ck selected by a phase-selection circuit 6 in FIG. 1.

Each of FIG. 2 and FIG. 3 is a diagram explaining a phase of the output clock signal vco_ck selected by the phase-selection circuit 6. This specification explains that the phase-selection circuit 6 selects any one of 512 phases into which one period of a clock of the output clock signal vco_ck is equally divided (in FIGS. 2 and 3, described as "0" to "511"). The phase-selection circuit 6 functions as a phase interpolator that interpolates a rising edge in an arbitrary phase.

Hereinafter, with reference to FIGS. 4 to 7, operation of the phase-selection circuit 6 will be explained in more detail.

Figure 4:
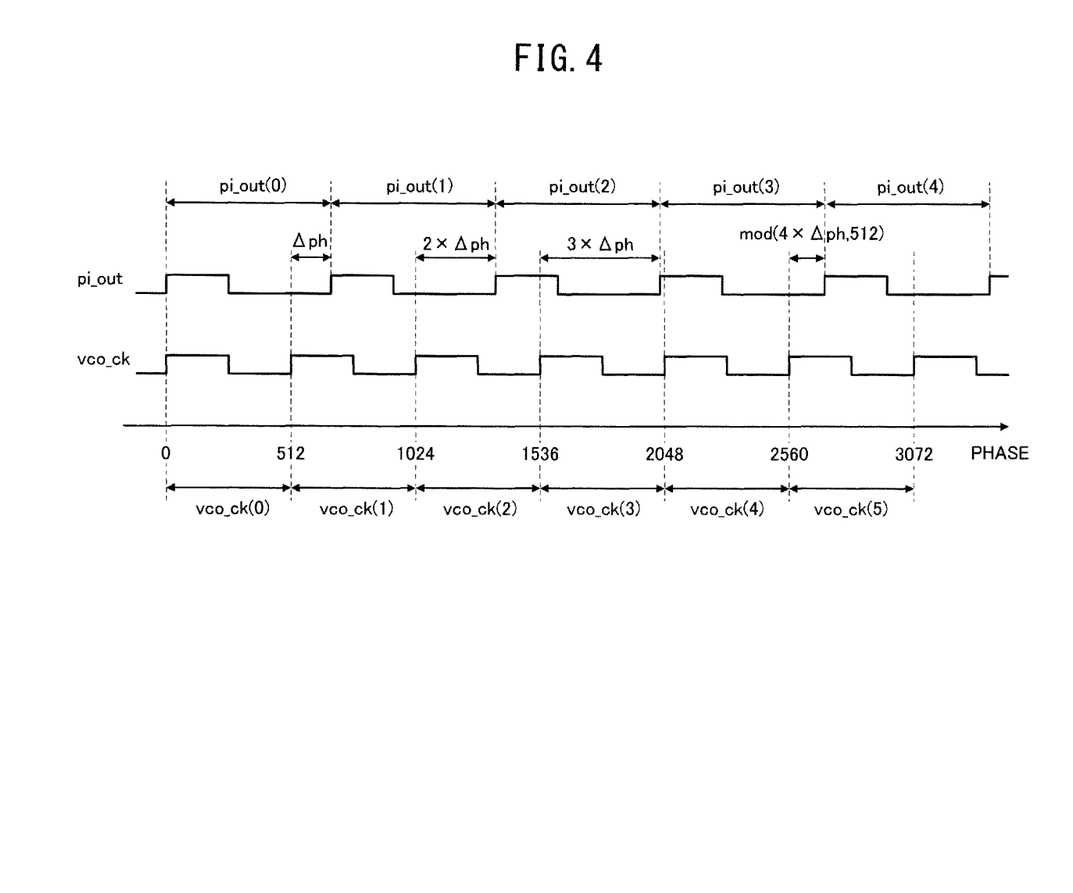
FIG. 4 illustrates a phase-shift performed by the phase-selection circuit 6 in FIG. 1, and is a timing diagram illustrating the phase-shift in a case where a phase-shift amount Δph is positive.

FIG. 4 illustrates a phase-shift performed by the phase-selection circuit 6 in FIG. 1, and is a timing diagram illustrating the phase-shift in a case where a phase-shift amount $\Delta ph$ is positive. A horizontal axis in FIG. 4 takes 512 phases into which one period of a clock of the output clock signal vco_ck is equally divided as a unit (hereinafter, from FIG. 5 to FIG. 11, phases are expressed by the same unit). In a case of FIG. 4, a period of the phase-shift clock signal pi_out becomes a length that is increased by the phase-shift amount $\Delta ph$ from a period of the output clock signal vco_ck (that is, 512+$\Delta ph$). In particular, note that a rising edge of a first clock vco_ck (0) of the output clock signal and a rising edge of a first clock pi_out (0) of the phase-shift clock signal correspond with each other. A rising edge of a second clock pi_out (1) of the phase-shift clock signal is delayed by the phase-shift amount $\Delta ph$ from the a rising edge of a second clock vco_ck (1) of the output clock signal. A rising edge of a third clock pi_out (2) of the phase-shift clock signal is delayed by a factor of 2 of the phase-shift amount. $\Delta ph$ from a rising edge of a third clock vco_ck (2) of the output clock signal. Hereinafter, likewise, a rising edge of an nth clock pi_out (n−1) of the phase-shift clock signal is delayed by a factor of n−1 of the phase-shift amount $\Delta ph$ from a rising edge of an nth clock vco_ck (n−1) of the output clock signal.

Figure 5:
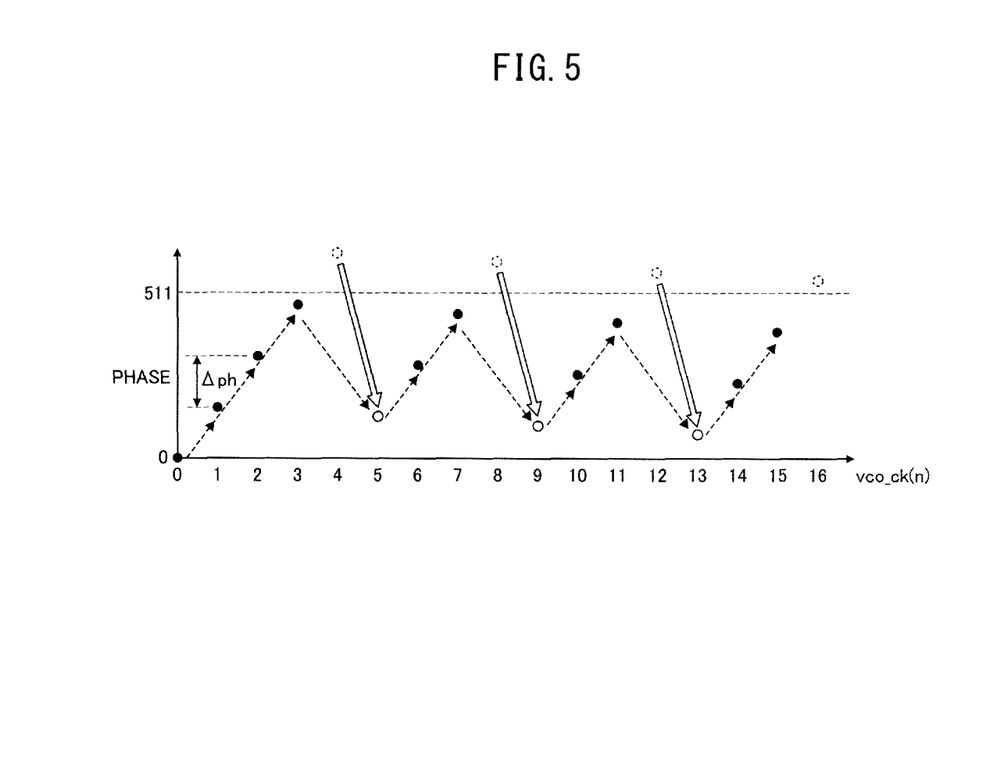
FIG. 5 is a graph illustrating a phase selected by the phase-selection circuit 6 in a case of performing the phase-shift in FIG. 4.

FIG. 5 is a graph illustrating a phase selected by the phase-selection circuit 6 in a case of performing the phase-shift in FIG. 4. The phase-selection circuit 6 selects any one of the 512 phases "0" to "511" into which one period of a clock of the output clock signal vco_ck is equally divided as a present phase. As illustrated in FIG. 5, the phase-selection circuit 6 selects a phase incremented by the phase-shift amount $\Delta ph$ as a new present phase, each time a clock of the output clock signal vco_ck advances. Note that in a case where an increment by the phase-shift amount $\Delta ph$ is performed and a sum of the present phase and the phase-shift amount $\Delta ph$ is less than one period of a clock of the output clock signal vco_ck (that is, in a case where a phase after the increment is less than or equal to "511"), a rising edge of a following clock of the phase-shift clock signal pi_out is in a relevant phase in a period of a following clock of the output clock signal vco_ck. On the other hand, in a case where an increment by the phase-shift amount $\Delta ph$ is performed and a sum of the present phase and the phase-shift amount $\Delta ph$ is equal to or more than one period of a clock of the output clock signal vco_ck (that is, in a case where a phase after the increment is equal to or more than "512"), the rising edge of the following clock of the phase-shift clock signal pi_out is not in a period of the following clock of the output clock signal vco_ck, but in a phase where "512" is subtracted from the phase after the increment in a period of a clock after the following clock of the output clock signal vco_ck. In the latter case, for example, as illustrated in FIG. 4, a rising edge of a fifth clock pi_out (4) of the phase-shift clock signal is not in a period of a fifth clock vco_ck (4) of the output clock signal, but in a period of a sixth clock vco_ck (5) of the output clock signal, and is delayed by mod (4×Δph, 512), that is, a remainder when 4×Δph is divided by 512, from a rising edge of the sixth clock vco_ck (5) of the output clock signal. This is expressed by a white arrow in FIG. 5, and in place of selecting phases expressed by dotted circles in clocks vco_ck (4), vco_ck (8), and vco_ck (12) of the output clock signal, phases expressed by solid-lined white circles in clocks following the clocks vco_ck (4), vco_ck (8), and vco_ck (12) are selected.

Thus, by selecting a phase as explained with reference to FIG. 4 and FIG. 5, a period of each of the clocks pi_out (0), pi_out (1), . . . , pi_out (n) of the phase-shift clock signal always becomes a length that is increased by the phase-shift amount Δph from a period of the output clock signal vco_ck (that is, 512+Δph).

Figure 6:
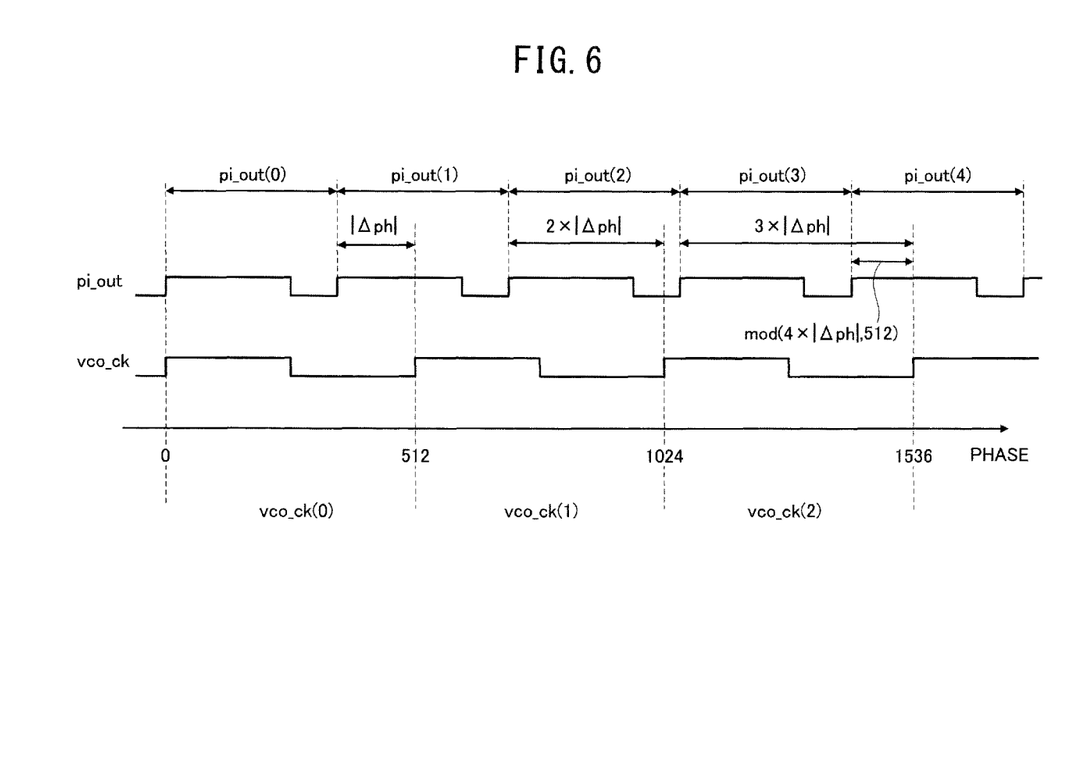
FIG. 6 illustrates a phase-shift performed by the phase-selection circuit 6 in FIG. 1, and is a timing diagram illustrating the phase-shift performed by the phase-selection circuit 6 in a case where a phase-shift amount Δph is negative.

FIG. 6 illustrates a phase-shift performed by the phase-selection circuit 6 in FIG. 1, and is a timing diagram of the phase-shift performed by the phase-selection circuit 6 in a case where a phase-shift amount Δph is negative. In the case of FIG. 6, a period of the phase-shift clock signal pi_out is a length that is decreased by the phase-shift amount Δph from a period of the output clock signal vco_ck (that is, 512−|Δph|). In particular, note that a rising edge of a first clock vco_ck (0) of the output clock signal and a rising edge of a first clock pi_out (0) of the phase-shift clock signal correspond with each other. A rising edge of a second clock pi_out (1) of the phase-shift clock signal is hastened by the phase-shift amount Δphi from a rising edge of a second clock vco_ck (1) of the output clock signal. A rising edge of a third clock pi_out (2) of the phase-shift clock signal is hastened by a factor of 2 of the phase-shift amount |Δph| from a rising edge of a third clock vco_ck (2) of the output clock signal. Hereinafter, likewise, a rising edge of an nth clock pi_out (n−1) of the phase-shift clock signal is hastened by a factor of n−1 of the phase-shift amount |Δph| from a rising edge of an nth clock vco_ck (n−1) of the output clock signal.

Figure 7:
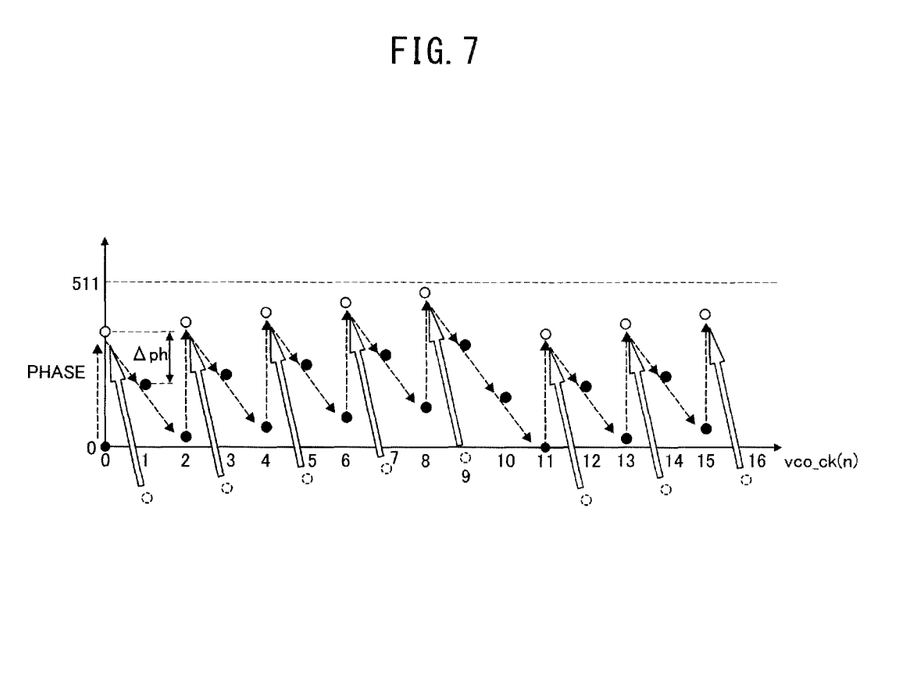
FIG. 7 is a graph illustrating a phase selected by the phase-selection circuit 6 in a case of performing the phase-shift in FIG. 6.

FIG. 7 is a graph illustrating a phase selected by the phase-selection circuit 6 in a case of performing the phase-shift in FIG. 6. As illustrated in FIG. 7, each time a clock of the output clock signal vco_ck advances, the phase-selection circuit 6 selects a phase decremented by the phase-shift amount |Δph|. Note that in a case where a decrement by the phase-shift amount |Δph| is performed and a phase after the decrement does not become negative, a rising edge of a following clock of the phase-shift clock signal pi_out is in a relevant phase in a period of a following clock of the output clock signal vco_ck. On the other hand, in a case where a decrement by the phase-shift amount |Δph| is performed and a phase after the decrement becomes negative, a rising edge of a following clock of the phase-shift clock signal pi_out is not in a period of a following clock, but in a phase where "512" is added to the phase after the decrement in a period of a present clock of the output clock signal vco_ck. In the latter case, for example, as illustrated in FIG. 6, a rising edge of a fifth clock pi_out (4) of the phase-shift clock signal is not in a period of a fourth clock vco_ck (3) of the output clock signal, but in a period of a third clock vco_ck (2) of the output clock signal, and is hastened by mod (4×|Δph|, 512), that is, a remainder when 4×|Δph| divided by 512, from a rising edge of the fourth clock vco_ck (3) of the output clock signal. This is expressed by a white arrow in FIG. 7, and in place of selecting phases expressed by dotted circles in clocks vco_ck (1), vco_ck (3), . . . of the output clock signal, phases expressed by solid-lined white circles in clocks prior to the clocks vco_ck (1), vco_ck (3), . . . are selected.

Thus, by selecting a phase as illustrated with reference to FIG. 6 and FIG. 7, a period of each clock pi_out (0), pi_out (1), . . . , pi_out (n) of the phase-shift clock signal always becomes a length that is decreased by the phase-shift amount |Δph| from a period of the output clock signal vco_ck (that is, 512−|Δph|).

The phase controller 5, determines a phase of a rising edge of the phase-shift clock signal pi_out, as explained with reference to FIGS. 4 to 7, and controls operation of the phase-selection circuit 6 in accordance with the determined phase.

When a frequency of the phase-shift clock signal pi_out is taken as fpi_out, and a frequency of the output clock signal vco_ck is taken as fvco_ck, the following expression is established.

$$fpi\_out = fvco\_ck \times 512/(512+\Delta ph) \quad \text{[Expression 1]}$$

At this time, as described above, the fractional PLL circuit according to the present embodiment performs the negative feedback control such that the frequency and the phase of the feedback signal fb_ck correspond to the frequency and the phase of the input clock signal comp_ck. Therefore, when the frequency of the input clock signal comp_ck is taken as fcomp_ck, and the frequency of the feedback signal fb_ck is taken as ffb_ck, and additionally, in order to simplify, when the frequency division ratio of the frequency divider 7 is assumed to be 1, among the frequency of each signal, the following expressions are established.

$$ffb\_ck = fpi\_out = fcomp\_ck \quad \text{[Expression 2]}$$

$$fcomp\_ck = fvco\_ck \times 512/(512+\Delta ph) \quad \text{[Expression 3]}$$

$$fvco\_ck = fcomp\_ck \times (1+\Delta ph/512) \quad \text{[Expression 4]}$$

As to the fractional PLL circuit according to the present embodiment, by improving resolution in the phase-selection circuit 6, it is possible to achieve an extremely small multiplication ratio (for example, the multiplication ratio which is less than or equal to 1%).

In the explained embodiment, a smallest multiplication ratio becomes 1/512≈0.002=0.2%.

As explained above, as to the fractional PLL circuit according to the present embodiment, since the frequency division ratio of the frequency divider 7 is a fixed value when operating, and frequencies of the phase clock signal pi_out and the feedback signal fb_ck are also constant, it is possible to eliminate a phase mismatch occurring in the phase frequency comparator 1 as in the conventional technique when changing the frequency division ratio of the frequency divider, prevent a spurious output clock signal vco_ck due to the phase mismatch, and reduce jitter of the output clock signal vco_ck. And additionally, according to the fractional PLL circuit of the present embodiment, it is possible to make the frequency division ratio of the frequency divider 7 smaller by improving the resolution in the phase-selection circuit 6, and as a result, it is possible to increase the loop bandwidth of the fractional PLL circuit and reduce the jitter of the output clock signal vco_ck. Thus, according to the present embodiment, it is possible to provide a new fractional PLL circuit that is achieved not by the principle of operation that changes the frequency division ratio of the frequency divider Second Embodiment A fractional PLL circuit according to the present embodiment, in addition to the operation explained in the first embodiment, has a feature such that frequency dividing of the output clock signal vco_ck is performed by the phase-selection circuit 6.

A constitution of the fractional PLL circuit is the same as that illustrated in FIG. 1. Hereinafter, it is assumed that a frequency division ratio of the phase-selection circuit 6 is 2. Additionally, in order to explain, it is assumed that the frequency divider 7 has a frequency division ratio 1 (or the frequency divider 7 is removed).

Figure 8:
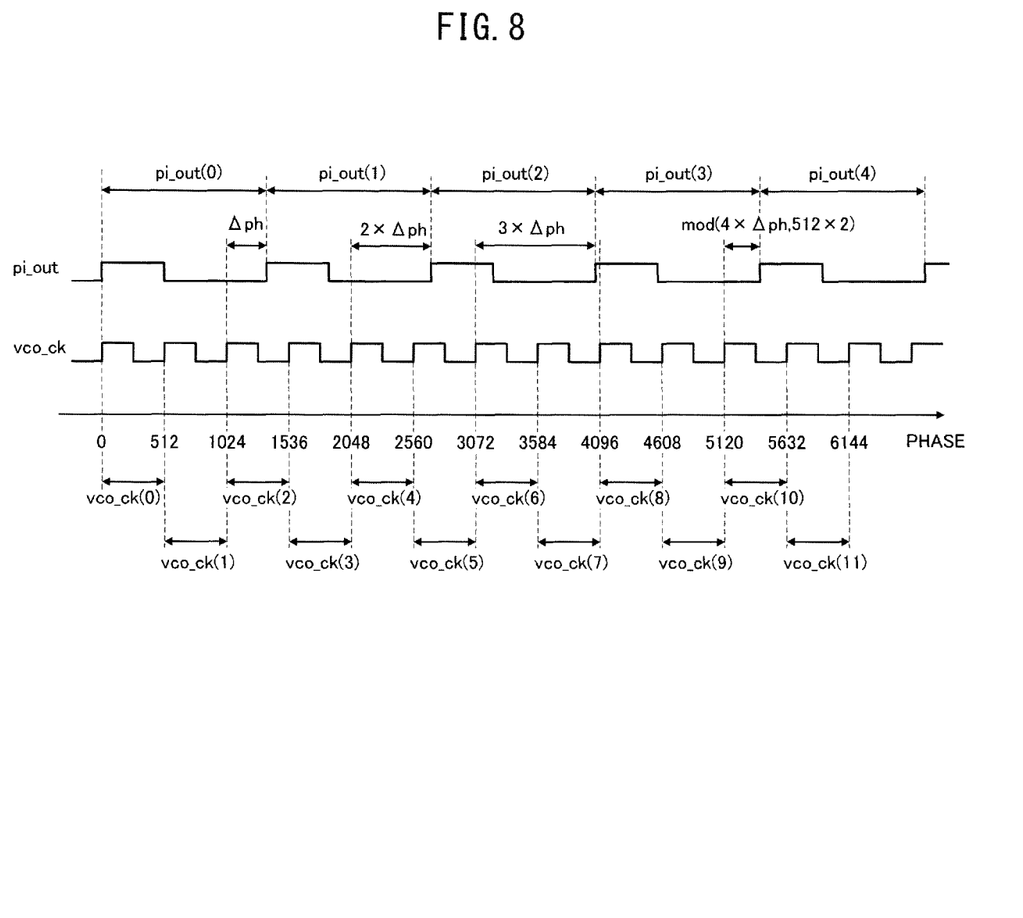
FIG. 8 illustrates a phase-shift performed by a phase-selection circuit of a fractional PLL circuit according to a second embodiment of the present invention, and is a timing diagram illustrating the phase-shift in a case where a phase-shift amount Δph is positive.

FIG. 8 illustrates a phase-shift performed by a phase-selection circuit of a fractional PLL circuit according to the second embodiment of the present invention, and is a timing diagram of the phase-shift in a case where a phase-shift amount Δph is positive. In a case of FIG. 8, a period of the phase-shift clock signal pi_out is a length that is increased by the phase-shift amount Δph from a period of 2 clocks of the output clock signal vco_ck (that is, becomes 512×2+Δph). In particular, note that a rising edge of a first clock vco_ck (0) of the output clock signal and a rising edge of a first clock pi_out (0) of the phase-shift clock signal correspond with each other. A rising edge of a second clock pi_out (1) of the phase-shift clock signal is delayed by the phase-shift amount Δph from a rising edge of a third clock vco_ck (2) of the output signal clock. A rising edge of a third clock pi_out (2) of the phase-shift clock signal is delayed by a factor of 2 of the phase-shift amount Δph from a rising edge of a fifth clock vco_ck (4) of the output clock signal. Hereinafter, likewise, a rising edge of an nth clock pi_out (n−1) of the phase-shift clock signal is delayed by a factor of n−1 of the phase-shift amount Δph from a rising edge of a 2n−1th clock vco_ck (2n−2) of the output clock signal.

Figure 9:
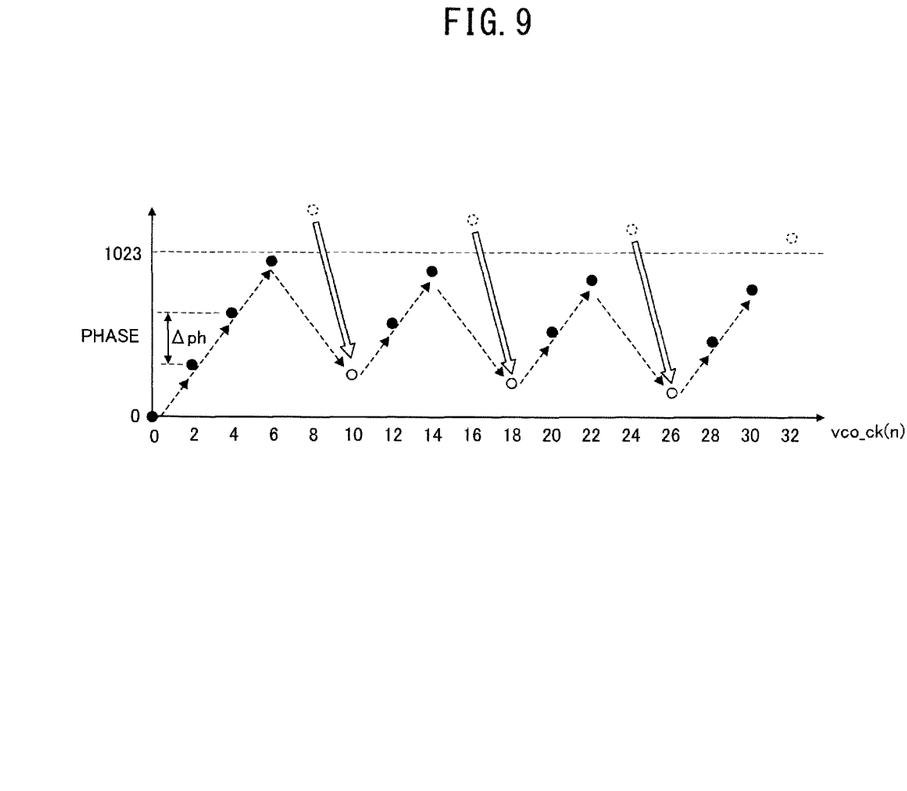
FIG. 9 is a graph illustrating a phase selected by the phase-selection circuit in a case of performing the phase-shift in FIG. 8.

FIG. 9 is a graph illustrating a phase selected by the phase-selection circuit in a case of performing the phase-shift in FIG. 8. The phase-selection circuit 6 selects any one of 1024 phases "0" to "1023" into which 2 periods of a clock of the output clock signal vco_ck are equally divided as a present phase. However, the phase-selection circuit 6 substantially selects any one of the 512 phases "0" to "511" into which 1 period of a clock of the output clock signal vco_ck is equally divided, as shown in FIG. 2 and FIG. 3. As illustrated in FIG. 9, each time 2 clocks of the output clock signal vco_ck advance, the phase-selection circuit 6 selects a phase that is incremented by the phase-shift amount Δph as a new present phase. Note that in a case where an increment by the phase-shift amount Δph is performed and a sum of the present phase and the phase-shift amount Δph is less than the period of 2 clocks of the output clock signal vco_ck (that is, in a case where a phase after the increment is less than or equal to "1023"), a rising edge of a following clock of the phase-shift clock signal pi_out is in a relevant phase in a period of the output clock signal vco_ck that is 2 or 3 clocks behind. On the other hand, in a case where an increment by the phase-shift amount Δph is performed and a sum of the present phase and the phase-shift amount Δph is equal to or more than the period of 2 clocks of the output clock signal vco_ck (that is, in a case where a phase after the increment is equal to or more than "1024"), the rising edge of the following clock of the phase-shift clock signal pi_out is in a phase where "1024" is subtracted from the phase after the increment in a period of the output clock signal vco_ck that is 4 or 5 clocks behind. In the latter case, for example, as illustrated in FIG. 8, a rising edge of a fifth clock pi_out (4) of the phase-shift clock signal is in a period of an 11th clock vco_ck (10) of the output clock signal, and is delayed by mod (4×Δph, 512×2), that is, a remainder when 4×Δph divided by 1024, from a rising edge of the 11th clock vco_ck (10) of the output clock signal.

Thus, by selecting a phase as illustrated with reference to FIG. 8 and FIG. 9, a period of each clock pi_out (0), pi_out (1), . . . , pi_out (n) of the phase-shift clock signal always becomes a length that is increased by the phase-shift amount Δph from the period of 2 clocks of the output clock signal vco_ck (that is, 512×2+Δph).

Figure 10:
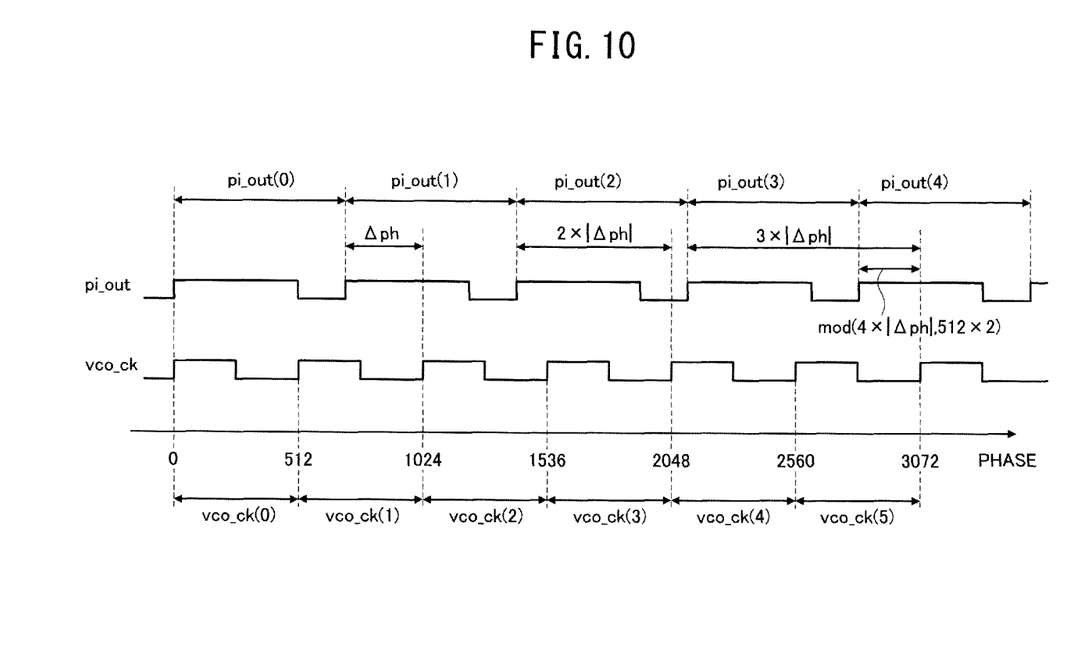
FIG. 10 illustrates a phase-shift performed by the phase-selection circuit of the fractional PLL circuit according to the second embodiment of the present invention, and is a timing diagram illustrating the phase-shift in a case where a phase-shift amount Δph is negative.

FIG. 10 illustrates a phase-shift performed by the phase-selection circuit of the fractional PLL circuit according to the second embodiment of the present invention, and is a timing diagram of the phase-shift in a case where a phase-shift amount Δph is negative. In a case of FIG. 10, a period of the phase-shift clock signal pi_out is a length that is decreased by a phase-shift amount |Δph| from a period of 2 clocks of the output clock signals vco_ck (that is, becomes 512×2−|Δph|). In particular, note that a rising edge of a first clock vco_ck (0) of the output clock signal and a rising edge of a first clock pi_out (0) of the phase-shift clock signal correspond with each other. A rising edge of a second clock pi_out (1) of the phase-shift clock signal is hastened by the phase-shift amount |Δph| from a rising edge of a third clock vco_ck (2) of the output clock signal. A rising edge of a third clock pi_out (2) of the phase-shift clock signal is hastened by a factor of 2 of the phase-shift amount |Δph| from a rising edge of a fifth clock vco_ck (4) of the output clock signal. Hereinafter, likewise, a rising edge of an nth clock pi_out (n−1) of the phase-shift clock signal is hastened by a factor of n−1 of the phase-shift amount |Δph| from a rising edge of a 2n−1 clock vco_ck (2n−2) of the output clock signal.

Figure 11:
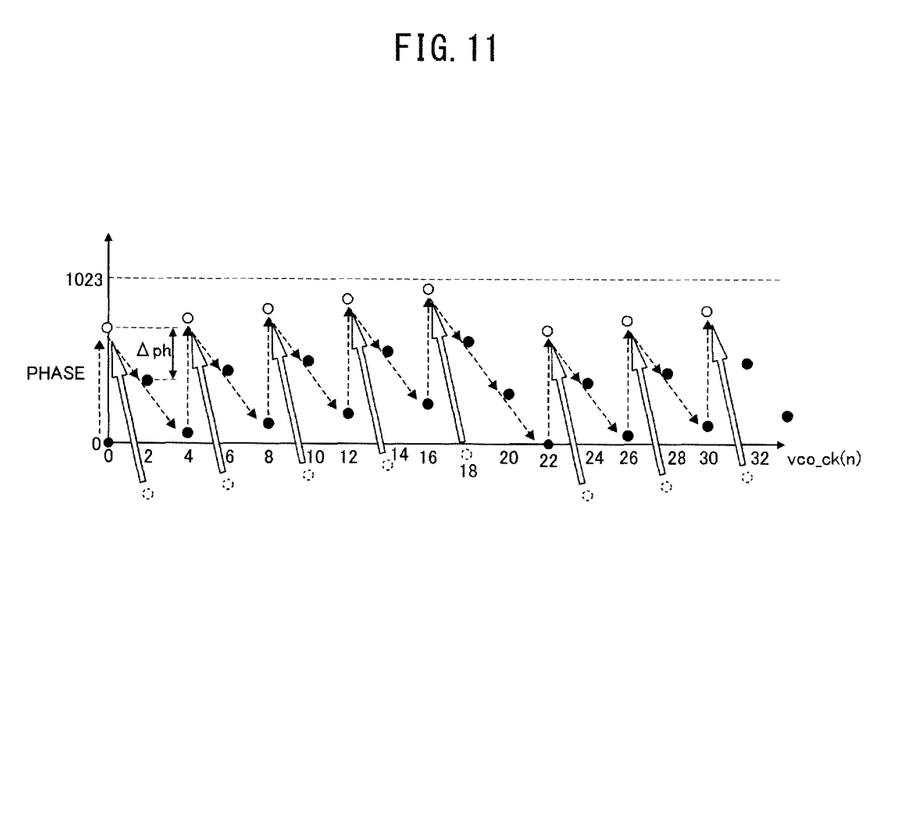
FIG. 11 is a graph illustrating a phase selected by the phase-selection circuit in a case of performing the phase-shift in FIG. 10.

FIG. 11 is a graph illustrating a phase selected by the phase-selection circuit in a case of performing the phase-shift in FIG. 10. As illustrated in FIG. 11, each time 2 clocks of the output clock signal vco_ck advance, the phase-selection circuit 6 selects a phase decremented by the phase-shift amount |Δph|. Note that in a case where a decrement by the phase-shift amount |Δph| is performed and a phase after the decrement does not become negative, a rising edge of a following clock of the phase-shift clock signal pi_out is in a relevant phase in a period of the output clock signal vco_ck that is 2 or 3 clocks behind. On the other hand, in a case where a decrement by the phase-shift amount |Δph| is performed and a phase after the decrement becomes negative, a rising edge of a following clock of the phase-shift clock signal pi_out is in a phase where "1024" is added to the phase after the decrement in a period of a present or following clock of the output clock signal vco_ck. In the latter case, for example, as illustrated in FIG. 10, a rising edge of a fifth clock pi_out (4) of the phase-shift clock signal is in a period of a sixth clock vco_ck (5) of the output clock signal, and is hastened by mod (4×|Δph|, 512×2), that is, a remainder when 4×|Δph| divided by 1024, from a rising edge of a seventh clock vco_ck (6) of the output clock signal.

Thus, by selecting a phase as explained with reference to FIG. 10 and FIG. 11, a period of each clock pi_out (0), pi_out (1), . . . , pi_out (n) of the phase-shift clock signal always becomes a length that is decreased by the phase-shift amount |Δph| from the period of 2 clocks of the output clock signal vco_ck (that is, 512×2−|Δph|).

The phase controller 5, determines a phase of a rising edge of the phase-shift clock signal pi_out as explained with reference to FIGS. 8 to 11, and controls operation of the phase-selection circuit 6 in accordance with the determined phase.

According to the fractional PLL circuit of the present embodiment, the phase-selection circuit 6 frequency-divides the output clock signal vco_ck at a frequency division ratio 2, so that Expression 1 is varied as shown in the following expression.

$$fpi\_out=(1/2)\times fvco\_ck\times 512\times 2/(512\times 2+\Delta ph) \quad \text{[Expression 5]}$$

Thus, the phase-selection circuit 6 performs the frequency dividing as described above, and therefore it is possible to improve the resolution of the fractional PLL circuit. When the frequency division ratio of the phase-selection circuit 6 is 2, the resolution of the fractional PLL circuit becomes twice compared to a case of the first embodiment of the present invention.

In the above explanation, it is assumed that the frequency divider 7 has the frequency division ratio 1 (or the frequency divider 7 is removed); however, by setting the frequency division ratio that is equal to or more than 2 to the frequency divider 7, a frequency dividing function of the phase-selection circuit 6 and a frequency dividing function of the frequency divider can be combined and used.

As a variant example of the explained embodiment, the phase-selection circuit 6 can equally divide one period of the output clock signal vco_ck into a different number of phases from 512 phases. Additionally, duty cycles of the output clock signal vco_ck and the phase clock signal pi_out can be different from those illustrated in FIGS. 4, 6, 8, and 10.

According to the fractional PLL circuit of the embodiments of the present invention, since the frequency division ratio of the frequency divider is a fixed value and the frequencies of the phase-shift clock signal and the feedback signal are also constant, it is possible to eliminate a phase mismatch occurring in the phase frequency comparator when the frequency division ratio of the frequency divider is changed as in the conventional technique, prevent a spurious output clock signal due to the phase mismatch, and reduce jitter of the output clock signal. And additionally, according to the fractional PLL circuit of the embodiments of the present invention, it is possible to make the frequency division ratio of the frequency divider smaller by improving the phase resolution in the phase-selection circuit, and as a result, it is possible to increase the loop bandwidth of the fractional PLL circuit and reduce the jitter of the output clock signal vco_ck.

Additionally, the phase-selection circuit frequency-divides the output clock signal, so that it is possible to improve the resolution of the fractional PLL circuit.

Thus, according to the embodiments of the present invention, it is possible to provide a new fractional PLL circuit that is achieved not by the principle of operation that changes the frequency division ratio of the frequency divider.

The phase frequency comparator 1, the charge pump 2, and the loop filter 3 are included in a phase comparator.

Industrial Applicability

According to the embodiments of the present invention, it is possible to provide a new fractional PLL circuit that is achieved not by the principle of operation that changes the frequency division ratio of the frequency divider Although the present invention has been described in terms of exemplary embodiments, it is not limited thereto. It should be appreciated that variations may be made in the embodiments described by persons skilled in the art without departing from the scope of the present invention as defined by the following claims.

The present application is based on and claims priority from Japanese patent application number 2011-059148, filed Mar. 17, 2011, the disclosure of which is hereby incorporated by reference herein its entirety.

The invention claimed is:

1. A fractional PLL circuit comprising:
   a phase comparator that detects phase difference between an input clock signal that is a reference and a feedback signal, and outputs a controlled voltage in accordance with the phase difference;
   a voltage-controlled oscillator that generates and outputs an output clock signal that has a frequency based on the controlled voltage;
   a phase-selection circuit that selects any one of a predetermined number of phases into which one period of a clock of the output clock signal is equally divided, generates a phase-shift clock signal that has a rising edge in the selected phase, and outputs the phase-shift clock signal as the feedback signal to the phase comparator; and
   a phase controller that determines a phase of the rising edge of the phase-shift clock signal selected by the phase-selection circuit such that a period of the phase-shift clock signal is a length that is changed by a predetermined phase-shift amount from a period of the output clock signal, and controls the phase-selection circuit so as to select the determined phase.

2. The fractional PLL circuit according to claim 1, further comprising:
   a frequency divider that frequency-divides the phase-shift clock signal, and outputs the frequency-divided phase-shift clock signal as the feedback signal to the phase comparator.

3. The fractional PLL circuit according to claim 1, wherein the phase controller determines a phase of a rising edge of the phase-shift clock signal selected by the phase-selection circuit such that a period of the phase-shift clock signal is a length that is changed by the predetermined phase-shift amount from a period of a predetermined number of clocks of the output clock signal.

4. The fractional PLL circuit according to claim 2, wherein the phase controller determines a phase of a rising edge of the phase-shift clock signal selected by the phase-selection circuit such that a period of the phase-shift clock signal is a length that is changed by a predetermined phase-shift amount from a period of a predetermined number of clocks of the output clock signal.

* * * * *